US012613372B2

(12) United States Patent
Hnatovsky et al.

(10) Patent No.: US 12,613,372 B2
(45) Date of Patent: Apr. 28, 2026

(54) LOW SCATTERING LOSS HIGH TEMPERATURE STABLE FIBER BRAGG GRATING SENSOR BASED ON MICROPORE FORMATION AND METHOD FOR PRODUCING SAME

(71) Applicant: NATIONAL RESEARCH COUNCIL OF CANADA, Ottawa (CA)

(72) Inventors: Cyril Hnatovsky, Ottawa (CA); Nurmemet Abdukerim, Ottawa (CA); Dan Grobnic, Ottawa (CA); Robert Walker, Spencerville (CA); Stephen Mihailov, Kanata (CA); Ping Lu, Stittsville (CA); Huimin Ding, Nepean (CA); David Coulas, Ottawa (CA); Kasthuri De Silva, Embrun (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 209 days.

(21) Appl. No.: 18/255,148

(22) PCT Filed: Dec. 4, 2020

(86) PCT No.: PCT/IB2020/061551
§ 371 (c)(1),
(2) Date: May 31, 2023

(87) PCT Pub. No.: WO2022/118062
PCT Pub. Date: Jun. 9, 2022

(65) Prior Publication Data
US 2024/0012195 A1     Jan. 11, 2024

(51) Int. Cl.
G02B 6/02 (2006.01)
G02B 5/18 (2006.01)
G03F 7/00 (2006.01)

(52) U.S. Cl.
CPC ....... G02B 6/02138 (2013.01); G02B 5/1814 (2013.01); G03F 7/0005 (2013.01); H01S 2302/00 (2013.01)

(58) Field of Classification Search
CPC . G02B 5/1814; G02B 6/02138; G03F 7/0005; H01S 2302/00
See application file for complete search history.

(56) References Cited

U.S. PATENT DOCUMENTS

| | | | |
|---|---|---|---|
| 4,807,950 A | 2/1989 | Glenn et al. | |
| 4,895,423 A | 1/1990 | Bilodeau et al. | |
| (Continued) | | | |

FOREIGN PATENT DOCUMENTS

| | | | |
|---|---|---|---|
| CA | 2768261 A1 | 1/2011 | |
| CA | 2768718 A1 | 2/2011 | |
| (Continued) | | | |

OTHER PUBLICATIONS

Abdukerim, Nurmemet, et al. "Complex diffraction and dispersion effects in femtosecond laser writing of fiber Bragg gratings using the phase mask technique." Optics Express 27.22 (2019): 32536-32555.
(Continued)

*Primary Examiner* — Daniel Petkovsek
(74) *Attorney, Agent, or Firm* — Perry + Currier

(57) ABSTRACT

A method and apparatus for inscribing a high-temperature stable Bragg grating in an optical waveguide, comprising the steps of: providing the optical waveguide; providing electromagnetic radiation from an ultrashort pulse duration laser, wherein the wavelength of the electromagnetic radiation has a characteristic wavelength in the wavelength range from 150 nanometers (nm) to 2.0 micrometers (μm); providing cylindrical focusing optics; providing a diffractive optical element that when exposed to the focused ultrashort laser pulse, creates an interference pattern on the optical wave-
(Continued)

guide, wherein the irradiation step comprises irradiating a surface of the diffractive optical element with the focused electromagnetic radiation, the electromagnetic radiation incident on the optical waveguide, from the diffractive optical element, being sufficiently intensive to cause permanent (Type II) change in the index of refraction within multiple Bragg grating planes in the core of the optical waveguide resulting from at least one micropore.

27 Claims, 4 Drawing Sheets

(56)                    References Cited

U.S. PATENT DOCUMENTS

| | | | |
|---|---|---|---|
| 5,007,705 | A | 4/1991 | Morey et al. |
| 5,104,209 | A | 4/1992 | Hill |
| 5,287,427 | A | 2/1994 | Atkins et al. |
| 5,367,588 | A | 11/1994 | Hill et al. |
| 5,400,422 | A | 3/1995 | Askins et al. |
| 5,532,493 | A | 7/1996 | Hale et al. |
| 5,761,111 | A | 6/1998 | Glezer |
| 5,771,251 | A | 6/1998 | Kringlebotn et al. |
| 5,830,622 | A | 11/1998 | Canning et al. |
| 5,861,020 | A | 1/1999 | Schwarzmaier |
| 5,976,390 | A | 11/1999 | Muramatsu |
| 6,072,926 | A | 6/2000 | Cole et al. |
| 6,334,018 | B1 | 12/2001 | Fokine |
| 6,404,956 | B1 * | 6/2002 | Brennan, III ...... G02B 6/02138 |
| | | | 372/102 |
| 6,878,900 | B2 | 4/2005 | Corkum et al. |
| 6,884,960 | B2 | 4/2005 | Bourne et al. |
| 6,888,125 | B2 | 5/2005 | Ronnekleiv et al. |
| 6,907,165 | B2 | 6/2005 | Liu et al. |
| 6,993,221 | B2 | 1/2006 | Mihailov et al. |
| 7,031,571 | B2 | 4/2006 | Mihailov et al. |
| 7,033,519 | B2 | 4/2006 | Taylor et al. |
| 7,171,093 | B2 | 1/2007 | Kringlebotn et al. |
| 7,228,017 | B2 * | 6/2007 | Xia ..................... G01N 21/7703 |
| | | | 385/124 |
| 7,245,795 | B2 | 7/2007 | Walker et al. |
| 7,323,677 | B1 | 1/2008 | Wang |
| 7,379,643 | B2 | 5/2008 | Mihailov et al. |
| 7,394,837 | B2 | 7/2008 | Shevy et al. |
| 7,438,824 | B2 | 10/2008 | Taylor et al. |
| 7,483,615 | B2 | 1/2009 | Mihailov et al. |
| 7,515,792 | B2 | 4/2009 | Mihailov et al. |
| 7,568,365 | B2 | 8/2009 | Schaffer et al. |
| 7,574,075 | B2 | 8/2009 | Xia |
| 7,606,452 | B2 | 10/2009 | Bilodeau et al. |
| 7,689,087 | B2 | 3/2010 | Mihailov et al. |
| 7,835,605 | B1 | 11/2010 | Wang et al. |
| 8,272,236 | B2 | 9/2012 | Smelser et al. |
| 8,402,789 | B2 | 3/2013 | Smelser et al. |
| 8,515,224 | B2 | 8/2013 | Vallee et al. |
| 8,727,613 | B2 | 5/2014 | Mihailov |
| 8,737,780 | B2 * | 5/2014 | Vallee ................ G02B 6/02138 |
| | | | 385/37 |
| 8,849,080 | B1 | 9/2014 | Manzur |
| 9,696,476 | B1 | 7/2017 | Glebov et al. |
| 10,141,709 | B2 | 11/2018 | Ishaaya et al. |
| 10,156,680 | B2 | 12/2018 | Grobnic et al. |
| 10,520,669 | B2 | 12/2019 | Mihailov et al. |
| 10,551,610 | B2 | 2/2020 | Brassard et al. |
| 10,886,125 | B1 | 1/2021 | Haick et al. |
| 11,698,302 | B2 | 7/2023 | Waltermann |
| 2002/0041724 | A1 | 4/2002 | Ronnekleiv et al. |
| 2003/0174947 | A1 * | 9/2003 | Sweetser ........... G02B 6/02152 |
| | | | 430/290 |
| 2004/0184731 | A1 | 9/2004 | Mihailov et al. |
| 2004/0184734 | A1 | 9/2004 | Mihailov et al. |
| 2004/0258377 | A1 | 12/2004 | Berkey et al. |
| 2006/0029322 | A1 | 2/2006 | Mihailov et al. |
| 2006/0219676 | A1 | 10/2006 | Taylor et al. |
| 2006/0251367 | A1 | 11/2006 | Seifert et al. |
| 2008/0310789 | A1 | 12/2008 | Mihailov et al. |
| 2009/0317928 | A1 | 12/2009 | Smelser et al. |
| 2011/0087112 | A1 | 4/2011 | Leo et al. |
| 2012/0039567 | A1 | 2/2012 | Herman et al. |
| 2012/0106893 | A1 * | 5/2012 | Kashyap ........... G02B 6/02133 |
| | | | 65/529 |
| 2016/0226220 | A1 | 8/2016 | Kanskar |
| 2017/0192168 | A1 | 7/2017 | Grobnic et al. |
| 2017/0299806 | A1 | 10/2017 | Kopp |
| 2018/0067254 | A1 | 3/2018 | Mihailov et al. |
| 2019/0049272 | A1 | 2/2019 | Grobnic et al. |
| 2021/0318488 | A1 | 10/2021 | Hnatovsky et al. |
| 2023/0194775 | A1 | 6/2023 | Hnatovsky et al. |

FOREIGN PATENT DOCUMENTS

| | | | | | |
|---|---|---|---|---|---|
| CN | 101349779 | A | * | 1/2009 | ............... G02B 6/02 |
| CN | 102162874 | A | | 8/2011 | |
| CN | 102226847 | A | * | 10/2011 | ............... G02B 6/02 |
| CN | 102576125 | A | | 7/2012 | |
| CN | 105158709 | A | | 12/2015 | |
| CN | 109581580 | A | * | 4/2019 | ............... G02B 6/02 |
| EP | 0978738 | A1 | * | 3/1998 | ............... G02B 6/16 |
| EP | 1341012 | A2 | | 3/2003 | |
| EP | 2460038 | A1 | | 6/2012 | |
| GB | 2514326 | A | | 11/2014 | |
| JP | H1138592 | A | | 2/1999 | |
| JP | 2000134153 | A | | 5/2000 | |
| JP | 2004506869 | A | | 3/2004 | |
| JP | 6220868 | B2 | | 10/2017 | |
| WO | WO-2005111677 | A2 | | 11/2005 | |
| WO | WO-2007137429 | A1 | | 12/2007 | |
| WO | WO-2011011890 | A1 | | 2/2011 | |
| WO | WO-2015154177 | A1 | | 10/2015 | |
| WO | WO-2017141188 | A1 | | 8/2017 | |
| WO | WO-2020170047 | A1 | | 8/2020 | |

OTHER PUBLICATIONS

Abdukerim, Nurmemet, et al. "High-temperature stable fiber Bragg gratings with ultrastrong cladding modes written using the phase mask technique and an infrared femtosecond laser." Optics Letters 45.2 (2020): 443-446.

Åslund, Mattias L., et al. "Optical loss mechanisms in femtosecond laser-written point-by-point fibre Bragg gratings." Optics express 16.18 (2008): 14248-14254.

Gamaly, Eugene G., et al. "Laser-matter interaction in the bulk of a transparent solid: Confined microexplosion and void formation." Physical Review B 73.21 (2006): 214101.

Martinez, Amos, et al. "Photoinduced modifications in fiber gratings inscribed directly by infrared femtosecond irradiation." IEEE photonics technology letters 18.21 (2006): 2266-2268.

Shimotsuma, Yasuhiko, et al. "Self-organized nanogratings in glass irradiated by ultrashort light pulses." Physical review letters 91.24 (2003): 247405.

Williams, Robert J., et al. "Optimizing the net reflectivity of point-by-point fiber Bragg gratings: the role of scattering loss." Optics Express 20.12 (2012): 13451-13456.

CN105158709A Machine translation, Dec. 2015.

JP2004506869A Machine translation, Mar. 2004.

Thomas, Jens, et al. "Cladding mode coupling in highly localized fiber Bragg gratings: modal properties and transmission spectra." Optics express 19.1 (2011): 325-341.

Grobnic, Dan, et al. "Growth dynamics of type II gratings made with ultrafast radiation." Optical Sensors. Optical Society of America, 2014.

Walker, Robert B., et al. "Entrained-flow gasifier and fluidized-bed combustor temperature monitoring using arrays of fs-IR written fiber Bragg gratings." 24th International Conference on Optical Fibre Sensors. vol. 9634. International Society for Optics and Photonics, 2015.

Riant, Isabelle et al. "Study of the photosensitivity at 193 nm and comparison with photosensitivity at 240 nm influence of fiber tension: type IIa aging." Journal of lightwave technology 15.8 (1997): 1464-1469.

(56)                    References Cited

OTHER PUBLICATIONS

Mihailov, Stephen J., et al. "Bragg grating inscription in various optical fibers with femtosecond infrared lasers and a phase mask." Optical Materials Express 1.4 (2011): 754-765.

Li, Yuhua, et al. "Fiber Bragg gratings with enhanced thermal stability by residual stress relaxation." Optics express 17.22 (2009): 19785-19790.

Chen, Kevin P., et al. "Self-heated fiber Bragg grating sensors." Applied Physics Letters 86.14 (2005): 143502.

Cavillon, Maxime, et al. "Overview of high temperature fibre Bragg gratings and potential improvement using highly doped aluminosilicate glass optical fibres." Journal of Physics: Photonics 1.4 (2019): 042001.

Bernier, M., et al. "Ytterbium fiber laser based on first-order fiber Bragg gratings written with 400nm femtosecond pulses and a phase-mask." Optics express 17.21 (2009): 18887-18893.

Smelser, Christopher W. et al. "Formation of Type I-IR and Type II-IR gratings with an ultrafast IR laser and a phase mask." Optics express 13.14 (2005): 5377-5386.

Martinez, Ams, et al. "Direct writing of fibre Bragg gratings by femtosecond laser." Electronics Letters 40.19 (2004): 1170-1172.

Allsop, T., et al. "Refractive index sensing with long-period grating fabricated in biconical tapered fibre." Electronics letters 41.8 (2005): 471-472.

Beresna, M. et al., "Polarization sensitive elements fabricated by femtosecond laser nanostructuring of glass." Optical Materials Express 1.4 (2011): 783-795.

Bernier, Martin, et al. "All-fiber DFB laser operating at 2.8 μm." Optics letters 40.1 (2015): 81-84.

Du, Yong, et al. "Fabrication of phase-shifted fiber Bragg grating by femtosecond laser shield method." IEEE Photonics Technology Letters 29.24 (2017): 2143-2146.

Grobnic, D., et al. "Bragg grating evanescent field sensor made in biconical tapered fiber with femtosecond IR radiation." IEEE Photonics Technology Letters 18.1 (2006): 160-162.

He, Jun, et al. "Highly birefringent phase-shifted fiber Bragg gratings inscribed with femtosecond laser." Optics letters 40.9 (2015): 2008-2011.

Hnatovsky, Cyril, et al., "Nonlinear photoluminescence imaging applied to femtosecond laser manufacturing of fiber Bragg gratings." Optics express 25.13 (2017): 14247-14259.

Hnatovsky, Cyril, et al. "Self-organized nanostructure formation during femtosecond-laser inscription of fiber Bragg gratings." Optics letters 42.3 (2017): 399-402.

Hoo, Yeuk L., et al. "Design and modeling of a photonic crystal fiber gas sensor." Applied Optics 42.18 (2003): 3509-3515.

Iadicicco, Agostino, et al. "Thinned fiber Bragg gratings as high sensitivity refractive index sensor." IEEE Photonics Technology Letters 16.4 (2004): 1149-1151.

Kashyap, R. et al., "UV written reflection grating structures in photosensitive optical fibres using phase-shifted phase masks." Electronics Letters 30.23 (1994): 1977-1978.

Keren, S. et al., "Distributed three-dimensional fiber Bragg grating refractometer for biochemical sensing." Optics letters 28.21 (2003): 2037-2039.

Loh, W. H. et al., "1.55 μm phase-shifted distributed feedback fibre laser." Electronics Letters 31.17 (1995): 1440-1442.

Love, J. D., et al. "Tapered single-mode fibres and devices. Part 1: Adiabaticity criteria." IEE Proceedings J (Optoelectronics) 138.5 (1991): 343-354.

Marshall, Graham D., et al. "Point-by-point written fiber-Bragg gratings and their application in complex grating designs." Optics express 18.19 (2010): 19844-19859.

Schroeder, Kerstin, et al. "A fibre Bragg grating refractometer." Measurement Science and Technology 12.7 (2001): 757-764.

Sheng, Yunlong et al., "Near-field diffraction of irregular phase gratings with multiple phase-shifts." Optics express 13.16 (2005): 6111-6116.

Silva, Susana, et al. "H 2 sensing based on a Pd-coated tapered-FBG fabricated by DUV femtosecond laser technique." IEEE photonics technology letters 25.4 (2013): 401-403.

Tremblay, Guillaume et al., "Effects of the phase shift split on phase-shifted fiber Bragg gratings." Journal of the Optical Society of America B Optical Physics 23.8 (2006): 1511-1516.

Villatoro, J. et al., "High resolution refractive index sensing with cladded multimode tapered optical fibre." Electronics letters 40.2 (2004): 106-107.

Wu, Qi et al., "High-sensitivity ultrasonic phase-shifted fiber Bragg grating balanced sensing system." Optics express 20.27 (2012): 28353-28362.

Mihailov, Stephen J. "Chapter 6: Femtosecond laser-inscribed fiber Bragg gratings for sensing applications." Opto-Mechanical Fiber Optic Sensors. Butterworth-Heinemann, 2018. 137-174.

Dostovalov, A. V., et al. "Point-by-point inscription of phase-shifted fiber Bragg gratings by femtosecond IR radiation in passive and active rare-earth doped optical fibers." 2017 Progress In Electromagnetics Research Symposium-Spring (PIERS). IEEE, 2017.

Swanton, A., et al. "Use of e-beam written, reactive ion etched, phase masks for the generation of novel photorefractive fibre gratings." Microelectronic engineering 30.1-4 (1996): 509-512.

Burgmeier, Jörg, et al. "Point-by-point inscription of phase-shifted fiber Bragg gratings with electro-optic amplitude modulated femtosecond laser pulses." Optics letters 39.3 (2014): 540-543.

Li, Hongpu, et al. "Optimization of a continuous phase-only sampling for high channel-count fiber Bragg gratings." Optics Express 14.8 (2006): 3152-3160.

Machine Translation of JP 6220868 82, Oct. 25, 2017. (Year: 2017).

Qin, Huabao, et al. "Compact linear polarization spectrometer based on radiation mode shaped in-fiber diffraction grating." Optics Letters 44.21 (2019): 5129-5132.

Rahnama, Abdullah, et al. "Ultracompact Lens-Less "Spectrometer in Fiber" Based on Chirped Filament-Array Gratings." Advanced Photonics Research 1.2 (2020): 2000026.

Wagener, Jefferson L., et al. "Fiber grating optical spectrum analyzer tap." Integrated Optics and Optical Fibre Communications, 11th Inter-national Conference on, and 23rd European Conference on Optical Communications (Conf. Publ. No. 448). vol. 5. IET, 1997.

* cited by examiner

LOW SCATTERING LOSS HIGH TEMPERATURE STABLE FIBER BRAGG GRATING SENSOR BASED ON MICROPORE FORMATION AND METHOD FOR PRODUCING SAME

FIELD OF THE INVENTION

The present invention relates in general to the inscription of Bragg gratings in optical waveguides, and in particular to using femtosecond pulse duration lasers and specialized transmission diffractive elements and to a fiber Bragg grating sensor capable of measuring temperature, strain, and environment at temperatures up to 1000° C.

BACKGROUND OF THE INVENTION

Fiber Bragg grating sensors (FBG sensors) are attractive devices for performing quasi-distributed temperature and strain measurements along an optical fiber. Variations in the spectral response of the FBG result from changes in its period ($\Lambda_G$) and effective refractive index ($n_{eff}$) due to strains or temperature variations that are experienced by the optical fiber when placed in a specific environment. FBG sensors offer important advantages over other sensor technologies because of their electrically passive operation, immunity to electromagnetic interference (EMI), high sensitivity, and multiplexing capabilities. FBGs are simple, intrinsic sensing elements which traditionally have been photo-inscribed into photosensitive Ge-doped silica fiber using ultraviolet (UV) radiation. Each FBG sensor has a characteristic retro-reflective Bragg resonance or Bragg wavelength ($\lambda_B$), which is dependent upon the periodicity of the grating photo-inscribed within the fiber (i.e., $\Lambda_G$) and the effective refractive index of the fundamental core mode of the optical fiber (i.e., $n_{eff}$). FBG sensors can be multiplexed in a serial fashion along a length of single fiber to produce a quasi-distributed optical fiber sensor array. When embedded into composite materials, optical fibers with an array of FBG sensors allow for distributed measurements of load, strain, temperature, and vibration of the material creating what is commonly referred to as "smart structures" where the health and integrity of the structure is monitored on a real-time basis.

Typically, FBGs are generated by exposing the UV-photosensitive core of a germanium-doped (Ge-doped) silica core optical fiber to a spatially modulated UV laser beam in order to create refractive index changes in the fiber core that are permanent at room temperature. Such a spatially modulated UV beam can be created by using a two-beam interference technique as disclosed in U.S. Pat. No. 4,807,950 by Glenn et al. or by using a phase mask as disclosed in U.S. Pat. No. 5,367,588 by Hill et al. The techniques taught by Glenn and Hill result in FBGs that can be erased at temperatures significantly lower than the glass transition temperature and are typically referred to as Type I gratings.

A limitation of the prior-art UV-induced Type I FBGs, especially for high temperature sensing applications, is that operation of the FBG sensor at elevated temperatures results in the erasure or annealing of the UV-induced color centers and densification that are responsible for the induced index change of the FBG. In fact, for silica ($SiO_2$) fibers total erasure of the induced index modulation occurs at 1000° C. Also, the fiber itself is modified when exposed to such high temperatures in an oxygen-containing atmosphere: the fiber can be easily deformed by its own weight, become brittle and the core material can diffuse into the cladding.

Another method for creating permanent photorefractive index changes in glasses employs the use of intensive UV beams with fluences (i.e., energy/unit-area per laser pulse) that approach those required to produce macroscopic damage of the glass. Askins et al. in U.S. Pat. No. 5,400,422 teach a method for producing permanent photorefractive index changes in the photosensitive cores of Ge-doped optical fibers with a single high-intensity UV laser pulse. Such FBGs, which result from macroscopic damage to the optical fiber, can survive temperatures approaching the glass transition temperature and are typically referred to as Type II gratings. The high-intensity portions of the interference fringes created by two crossed UV beams split from a single UV beam create localized damage at the core-cladding interface within the fiber. Because the process for inducing index change is one of structural change due to localized physical damage to the glass, rather than due to UV photo-induced formation of color center defects, the induced index change is more robust and does not decrease at elevated temperatures. In fact, Askins et al. disclose that gratings produced in this way cannot be removed by annealing until the fiber or waveguide approaches the material's glass transition temperature. The drawback of this approach for induction of index change is that the resultant Bragg gratings have relatively low refractive index modulations ($\Delta n=10^{-4}$) and are mechanically weak since the effective refractive index change originates from periodic localized damage at the core-cladding interface. The damage occurs because for pulses longer than a few tens of picoseconds the laser-excited electrons transfer energy to the surrounding lattice faster than the thermal diffusion in the material can remove the energy from the volume that is being irradiated. Moreover, if the laser pulse continues to feed energy into the damage site, the damage can propagate beyond the irradiated zone. Consequently, the spectral quality of FBGs written with laser pulse durations greater than a few tens of picoseconds is often poor and the scattering loss of such FBGs is high. Scattering loss is defined as being the broadband transmission loss that is out-of-band or non-resonant with the Bragg grating resonance Aa.

Another method for creating permanent photorefractive index changes in optical fiber employs the use of the process of "hydrogen-loading," as taught by Atkins et al. in U.S. Pat. No. 5,287,427, combined with UV-laser exposure of optical fiber that is manufactured with a core that is co-doped with fluorine. After the UV exposure the fiber undergoes a thermal post treatment at 1000° C. in order to induce a chemical composition grating as taught by Fokine in U.S. Pat. No. 6,334,018. These FBGs have often been referred to in the literature as thermally regenerated FBGs. As with the technique taught by Askins et al., the technique taught by Fokine also has the drawback that the induced index change of the FBGs produced in this fashion have relatively low refractive index modulations ($\Delta n=10^{-4}$).

By using special optical fibers such as silica-based optical fibers with very high germanium concentrations in the core, Riant et al in *J. Lightwave Technol.* 15 (8), 1464 (1997) demonstrate that a sustained exposure to an interference pattern created with pulsed UV laser light will initially produce a Type I FBG which will erase and then subsequently regrow but at a shorter wavelength of the Bragg resonance. This Type of FBG has been found to have better thermal stability at 400° C. than a Type I FBG and has been dubbed a "Type IIA" FBG. The formation of the Type IIA FBG is the result of relaxation by the laser beam of high internal stresses present in the fiber due to the dissimilarities of the fiber core and cladding materials. The resultant FBG has a negative index change compared to the original Type I FBG. The limitation in this approach to writing thermally stable FBGs is that the FBG structure erases at temperatures approaching 600° C. and is limited to optical fibers possessing high internal stresses.

Another method for creating UV laser induced FBGs with higher thermal stability than Type I FBGs is taught by Liu et al. in U.S. Pat. No. 6,907,165, where sustained exposure of a hydrogen-loaded Boron-Germanium co-doped optical fiber to a UV interference pattern results in the formation of a Type I FBG, its subsequent erasure and then the formation of what is called a Type IA FBG with better thermal properties. As in the approach demonstrated by Riant et al. for Type IIA FBGs, sustained exposure to the UV laser beam results in Type I grating formation, its erasure and the formation of another grating with better thermal stability but with a positive index change. As in the case of Type IIA FBGs, this approach requires specialty optical fibers as well as hydrogen loading ($H_2$-loading). Furthermore, the induced index change is annealed out at temperatures above 500° C.

The fabrication of high-temperature stable FBGs using ultrafast infrared radiation and a phase mask, as taught by Mihailov et al. in U.S. Pat. No. 6,993,221 results in high temperature stable FBGs with very high index modulations ($\Delta n > 10^{-3}$). For Ge-doped silica optical fibers, Smelser et al. showed in Opt. Express., vol. 13, pp. 5377-5386, (2005), that these high-temperature stable FBGs are formed as a result of traversing an intensity threshold $I_{th}$. When using multiple irradiating femtosecond infrared (fs-IR) laser pulses with beam intensities greater than $I_{th}=4\times10^{13}$ W/cm$^2$ in the core region of the optical fiber, the formation of thermally stable FBGs that are similar to Type II UV-induced FBGs was observed. In the case of FBGs fabricated using the techniques taught in U.S. Pat. No. 6,993,221, the index modulation results from a threshold-type process of multiphoton ionization. Recently, Hnatovsky et al. showed in Opt. Lett., vol. 42, pp. 399-402, 2017 that by utilizing the exposure conditions taught in U.S. Pat. No. 6,993,221, form-birefringent planar self-organized nanostructures are created similar to those demonstrated by Shimotsuma et al. in Phys. Rev. Lett., vol. 91, article 247405, 2003. Although strong FBGs can be formed using the approach taught in U.S. Pat. No. 6,993,221, the underlying Type II material modification introduces high scattering loss making it difficult to concatenate a large number of FBG sensors into a sensor array on a single length of optical fiber. The threshold nature of the process also makes it more difficult to tailor the induced index profile of the grating in terms of its apodization, reflectivity and reflection bandwidth. Using the technique taught by Mihailov et al. in U.S. Pat. No. 7,031,571, Smelser et al. also showed that very high index modulations ($\Delta n > 10^{-3}$) could be created with laser beam intensities lower than $I_{th}=4\times10^{13}$ W/cm$^2$ that did not possess high scattering loss. However these FBGs were not high-temperature stable and the index modulation likely arising from color center formation and material densification, erased at temperatures >800° C.

Smelser et al. in U.S. Pat. No. 8,272,236 taught that the induction of FBGs using multiple fs-IR laser pulses, with each pulse having the intensity below the single-pulse intensity threshold for Type II FBG formation, could produce extremely large index modulations ($\Delta n > 3\times10^{-3}$). Beside the sustained laser exposures these FBGs require photosensitization of the optical fiber to IR radiation, similar to the Type I FBGs fabrication method in Ge-doped $H_2$-loaded optical fiber taught by Mihailov et al. in U.S. Pat. No. 7,515,792. Beneficially, the resultant Type II FBGs not only have a portion of their index modulation that is thermally stable at 1000° C. but also have low scattering loss. Serious limitations to this approach result from the requirement of prolonged laser exposures, which introduces wear and tear on the inscription laser as well as reducing the mechanical strength of the irradiated optical fiber. Additionally, the extra processing step of photosensitization can only be applied to Ge-doped fiber and is therefore ineffective for other silica-based optical fibers.

The requirement for use of $H_2$-loading of Ge-doped fiber is eliminated in the process taught by Smelser et al. in U.S. Pat. No. 8,402,789 where a Type I FBG is initially written using multiple laser pulses at intensities below the single-pulse intensity threshold for Type II FBG formation. This pre-conditioning of the optical fiber has the effect of lowering the $I_{th}$ for Type II FBG formation by 25%. By lowering the threshold for multi-pulse Type II FBG formation and using lower grating inscription laser intensities, lower-loss thermally stable Type II FBG are realized.

Grobnic et al. in US Patent Publication 2019/0049272 A1 teaches a method to produce low-loss FBGs possessing high thermal stability using a sequence of single pulses of fs-IR radiation focused through a phase mask. The fs pulses emanate from a regeneratively amplified Ti:sapphire laser that has a Fourier transform limited pulse duration of 80 fs. However, the pulses used for the FBG inscription are stretched to 300-500 fs by introducing a chirp to the pulses. The light intensity in the fiber core region is adjusted to be below the single-pulse intensity threshold for Type II index change but above the multi-pulse intensity threshold to induce Type II index change. The first few fs-IR laser pulses form a structure that behaves like a Type I FBG in terms of its spectral characteristics and thermal stability. With more fs-IR pulses deposited into the fiber, the Type I FBG first grows but then starts being erased, which is observed by monitoring its spectral characteristics. Grobnic et al. in US Patent Publication 2019/0049272 go on to teach that if at the point of erasure of the Type I FBG the exposure is stopped and the fiber is subsequently annealed above 600° C., a thermally stable grating appears with the same Bragg wavelength as the initial Type I FBG but with a very low scattering loss. An obvious disadvantage of this process is the necessity to have the extra step of annealing in order to realize a thermally stable FBG. Grobnic et al. in US Patent Publication 2019/0049272 also teaches that with more pulses into the fiber the initially formed Type I FBG eventually gets completely spectrally erased and then a regular Type II FBG appears and eventually grows to saturation. The scattering loss of such a Type II FBG can exceed 1 dB for a ~10 mm long exposed region of the fiber. On first appearance, this Type II FBG may seem to be related to Type IA or Type IIA regenerated FBGs as a similar sequence of steps is required to create it. Nevertheless, unlike regenerated FBGs, the Type II FBG under consideration, which can be more than 20 dB in transmission, neither requires $H_2$-loading or specialty fiber nor exhibits any shift in its Bragg wavelength. Its high thermal stability is likely the result of simultaneous induction of both Type I and Type II index change that with continued exposure leads to the dominance of the Type II index change.

Besides the earlier discussed phase mask technique there exists another widely used laser-writing technique to fabricate FBGs which is based on sequentially inducing changes along the fiber core. This point-by-point laser-writing technique was first described in U.S. Pat. No. 5,104,209 (1992) to Hill et al., where the FBGs were manufactured by pre-shaping a UV laser beam by a narrow slit mask and flashing the UV radiation into the fiber core while the fiber was precisely moved between each laser exposure with respect to the mask.

Khrushchev et al. in International Pat. No. WO/2005/111677 teach how sequential (i.e., point-by-point) laser writing can be implemented with fs-IR beams. In this case, the fs-IR pulses are tightly focused inside the fiber core region using a microscope objective having a high numerical aperture (NA=0.45-0.55) and the grating period produced is defined by a ratio of the translation speed of the stage on which the fiber is mounted to the pulse repetition rate of the laser. Using a variable attenuator the focused intensity can be adjusted to slightly alter the refractive index (i.e., Type I modification) in the fiber core region without causing permanent optical damage at lower intensity settings or produce permanent optical damage (i.e., Type II modification) in the core region at higher intensities. The permanent optical damage is produced with single laser pulses and is assumed to consist of voids surrounded by densified material. The effective refractive index in the optical fiber (or waveguide) is locally affected by the presence of a void in its vicinity. Even though Khrushchev et al. do not explicitly show the presence of voids in the core region, there exists extensive literature corroborating the formation of voids in transparent bulk materials by means of tightly focused fs-IR radiation, for example, Glezer et al. in in U.S. Pat. No. 5,761,111 (1998), Schaffer et al. in U.S. Pat. No. 7,568,365 B2 (2009). The physics of the formation of fs-light-induced voids in transparent bulk materials is discussed in detail by Gamaly et al. in *Phys. Rev. B* vol. 73, pp. 214101 (2006).

Khrushchev et al. in International Pat. No. WO/2005/111677 also note that voids, which underlie Type II modification in this case, are preferably be positioned slightly outside of the core. In such a location the voids do not introduce significant losses to the transmitted light due to strong scattering, whereas the material surrounding the voids intercepts the core and thus changes its effective refractive index. Alternatively, in order to have high-contrast change of effective refractive index $\Delta n_{eff}$ at the expense of higher scattering loss, voids can be formed inside the core. In this case, according to Martinez et al. in *IEEE Photonics Technol. Lea*. Vol. 18, pp. 2266 (2006), Åslund et al. in *Opt. Express* vol. 16, pp. 14248 (2008) and Williams et al. in *Opt. Express* vol. 20, pp. 13451 (2012), the scattering loss of the resultant Type-II FBGs is in the range from $10^{-4}$ dB to $2\times10^{-3}$ dB per single void, i.e. per grating period, depending on the laser-writing conditions. Such losses translate into ~1 dB per the resultant Type 11 FBG at the best, which severely limits the ability to concatenate many 1000° C.-resistant FBGs inside one fiber for quasi-distributed sensing.

Taylor et al. in U.S. Pat. No. 7,438,824, teach a method of producing thermally stable FBGs that utilize a variation of the point-by-point technique. Taylor et al. use multiple femtosecond pulses that have intensities lower than the single-pulse intensity threshold required to produce a micro-void. In the case of Taylor et al., each Bragg grating plane is created by a superposition of pulses that causes an index change that is the result of the formation of self-organized nanogratings within the Bragg grating plane. The resultant index change of this FBG is thermally stable up to 1000° C. but also creates high scattering loss as in the aforementioned methods of Khrushchev, Åslund and Williams.

To summarize, FBGs manufactured using infrared (IR) femtosecond lasers and the phase mask technique can be made thermally stable up to the glass transition temperature of the fiber into which they are written, which in the case of silica-based optical fibers is typically more than 1000° C.

Generally, in order to make an FBG 1000° C.-resistant, the laser-induced transformations in the fiber material need to be strong (i.e., laser-induced damage), which requires high laser intensities and exposures with multiple laser pulses. Because of the laser-induced damage in the fiber core, the resultant FBGs suffer from high scattering loss making it difficult to concatenate more than a few tens of such FBGs on a single fiber in order to fabricate a distributed fiber-optic sensor array for operation in extreme or high temperature environments. Optical losses can be reduced by using lower intensities and applying elaborate multi-pulse laser exposure protocols followed by annealing of the resultant FBGs at high temperature, which introduces wear and tear on the inscription laser as well as reduces the mechanical strength of the irradiated optical fiber.

As discussed above, low loss high temperature stable (up to 1000° C.) sensors based on FBGs can be manufactured using high-power ultraviolet (UV) sources and the phase mask technique. However, this approach requires hydrogen loading techniques, customized optical fibers and careful annealing of the resultant FBGs in a furnace according to a specific recipe, which makes the whole process expensive and cumbersome in an industrial manufacturing environment. Even though regenerated FBGs produced according to this procedure (referred to in the art as "regenerated gratings") can withstand 1000° C. and large numbers of such FBGs can be concatenated on a single fiber, they have very low reflectivities and are often of poor spectral quality.

Conversely, high temperature stable (up to 1000° C.) FBG sensors with relatively low losses and good spectral characteristics can be manufactured using IR femtosecond lasers and the point-by-point writing technique. In this case, the pulses are tightly focused inside the fiber core region and the grating planes of the FBG are produced one at a time by firing a laser pulse into the fiber core and then translating the fiber to a new position to write another grating plane. The permanent optical damage inside the grating consists of voids surrounded by densified material. The losses in the fiber associated with this inscription process limit the number of FBGs that can be concatenated on a single fiber to a few hundred at the best.

It is an object of this invention to overcome the aforementioned limitations within the prior art.

SUMMARY OF THE INVENTION

The inventors have discovered that 1000° C.-resistant FBGs with extremely low scattering loss—less than $10^{-5}$ dB per grating period—can be fabricated in silica fibers by utilizing the phase mask technique for grating inscription using a fs-IR laser to induce Type II modification in the fiber core. To improve the uniformity of the light intensity in the line-shaped laser focus along the fiber core, a fs-IR inscription beam with a quasi-flat-top intensity distribution may be used. Scanning electron microscopy (SEM) reveals that for single-pulse irradiation every grating plane of the FBG produced under these conditions, as seen by light guided in the fiber, consists of a highly elongated micropore embedded within a narrow region of resolidified glass. Thus, the phase mask technique combined with a fs-IR laser can be used to fabricate FBGs that possess thermal and spectral characteristics of highly localized FBGs produced by the point-by-point technique but have a much lower scattering loss. The latter aspect permits multiple hundreds of Type II FBGs to be concatenated in a single fiber, which is important for quasi-distributed sensing in harsh environments. Additionally, the invention is highly useful for mass production since laser writing based on the phase mask technique i) is generally very robust and reproducible and ii) represents parallel laser writing as opposed to sequential laser writing based on the point-by-point technique. The latter important aspect can be exemplified as follows: using the phase mask technique with a laser beam having a quasi-flat-top intensity distribution, many virtually identical grating planes (individual elongated micropores) spaced, for instance, by 500 nm can be created along the fiber core with a single laser pulse. For a Bragg grating that is 1 cm in length, this constitutes 20,000 grating planes or individual micropores. On the other hand, the laser needs to be fired 20,000 times and the fiber translated by 500 nanometers between each laser shot with a sub-nanometer precision if the point-by-point technique is used to produce a similar Bragg grating.

As set further below, a method is provided for method for inscribing a Bragg grating in an optical waveguide, comprising the steps of: providing electromagnetic radiation from an ultrashort pulse duration laser; providing a focusing optical element to focus the electromagnetic radiation from an ultrashort pulse duration laser; providing a diffractive optical element that when exposed to the focused electromagnetic radiation generates a beam on the optical waveguide having an interference pattern; and irradiating the optical waveguide with the electromagnetic radiation to form a Bragg grating, the electromagnetic radiation incident on the optical waveguide being sufficiently intensive to cause a permanent (Type II) change in the index of refraction within multiple Bragg grating planes in the core of the optical waveguide resulting from at least one micropore.

Additionally, an apparatus is set forth for inscribing a Bragg grating in an optical waveguide, comprising: an ultrashort pulse duration laser for providing electromagnetic radiation; a focusing optical element to focus the electromagnetic radiation from an ultrashort pulse duration laser; and a diffractive optical element that when exposed to the focused electromagnetic radiation from the focusing optical element produces an interference pattern in the optical waveguide, wherein positioning the optical waveguide at a distance with respect to the diffractive optical element along the propagation direction of the electromagnetic radiation where the confocal parameter of line-shaped laser focus is smallest and the peak intensity in the focus is highest causes the of i) negative spherical aberration and conical diffraction caused by the diffractive optical element and ii) chromatic aberration of the focusing optical element and chromatic dispersion of the diffractive optical element to substantially or completely cancel each other out; and wherein irradiating the optical waveguide with the electromagnetic radiation forms a Bragg grating, the electromagnetic radiation incident on the optical waveguide being sufficiently intensive to cause permanent (Type II) change in the index of refraction within multiple Bragg grating planes in the core of the optical waveguide resulting from at least one micropore when exposed to one of either a single laser pulse or a plurality of laser pulses, wherein said plurality is equal or less than ten.

In the present application, references to "a permanent change in an index of refraction within a core of the optical waveguide" represent the formation of a grating that is stable at a temperature up to just below the glass transition temperature of the material forming the optical waveguide being inscribed with the Bragg grating. This is also referred to herein and in the art as a Type II Bragg grating. In one embodiment, where the waveguide is a silica-based fiber, and a permanent change in the index of refraction within a core of the optical waveguide is one which is stable at temperatures of up to 1000° C. In other embodiments, where the optical waveguide comprises a different material (e.g. crystalline sapphire), the temperature may be higher than 1000° C. Also, in the present application, references to "Bragg grating plane" represents a localized refractive index variation that is seen by the guided modes propagating along the fiber as being a grating plane.

These together with other aspects and advantages, as well as a discussion of the prior art, are more fully set forth below, reference being had to the accompanying drawings forming a part hereof, wherein like numerals refer to like parts throughout.

BRIEF DESCRIPTION OF DRAWINGS

FIGS. 3(a) and 3(b), shows SEM images of modification in the core of the optical fiber induced by a single laser pulse, where FIG. 3(a) denotes an SEM image in backscattered electrons and FIG. 3(b) denotes an SEM image in secondary electrons.

FIGS. 4(a) and 4(b), shows SEM images of modification in the core of the optical fiber induced by five laser pulses, where FIG. 4(a) denotes an SEM image in backscattered electrons and FIG. 4(a) denotes an SEM image in secondary electrons.

DETAILED DESCRIPTION OF THE INVENTION

Figure 1:
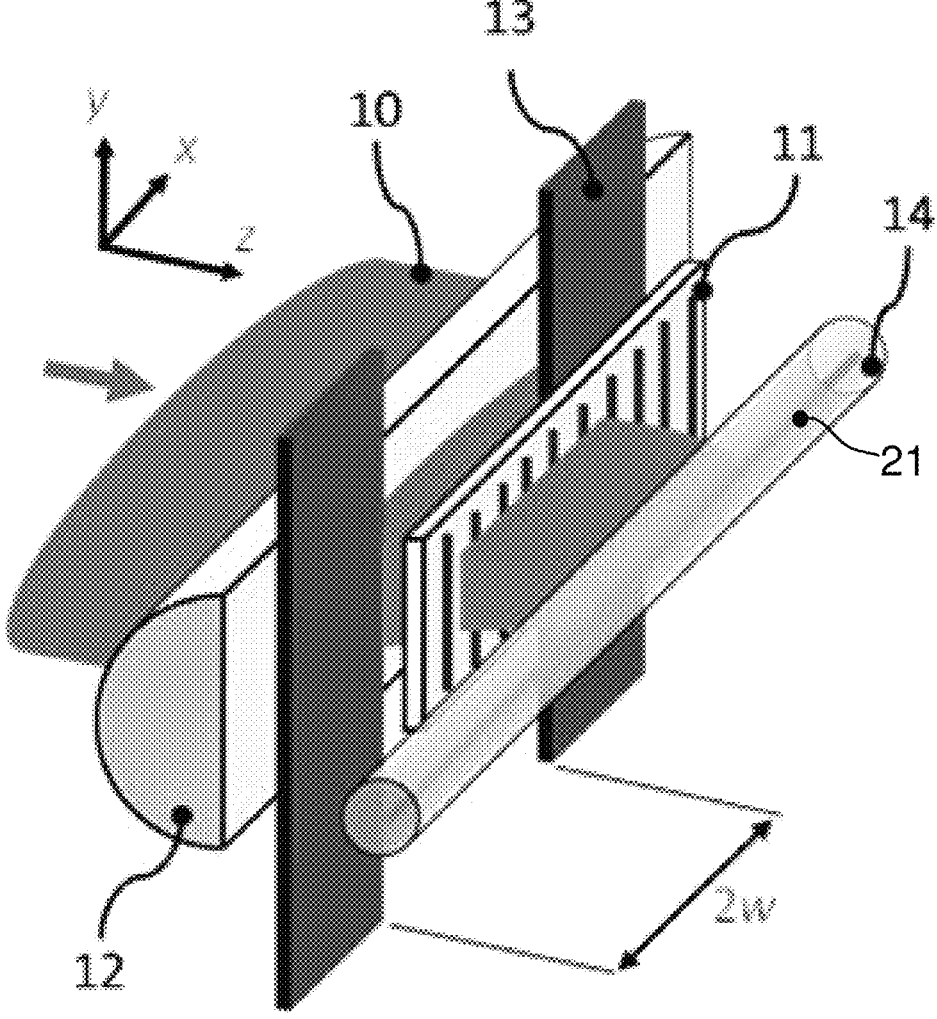
FIG. 1 depicts an interferometric setup based on the phase mask technique for the inscription of a fiber Bragg grating in an optical fiber, according to an exemplary embodiment.

FIG. 1 shows a linearly polarized femtosecond beam 10 generated, for example, by a regeneratively amplified Ti:sapphire femtosecond laser system with transform limited 80 fs pulses and operated at an 800 nm wavelength. The beam 10 is expanded ~3.5 times in the horizontal plane (i.e., along the x-axis, FIG. 1) and focused through a zeroth-order-nulled holographic phase mask 11 with a pitch $\Lambda$=1.07 μm (mask grooves are aligned along the y-axis) using a plano-convex cylindrical lens 12 having its curved surface designed to correct spherical aberration in one dimension. The effective numerical aperture of the cylindrical lens 12 in the yz-plane is estimated at 0.25. The beam expansion is used to produce a quasi-flat-top intensity distribution along the x-axis at the cylindrical lens 12. A slit 13 of width 2w≈15 mm is aligned along the y-axis and placed between the plano-convex cylindrical lens 12 and the phase mask 11, as depicted in FIG. 1. Optical fiber 14 (for example SMF-28 fiber manufactured by Corning Incorporated) with its protective coating removed, is placed ≈300 μm away from the phase mask 11 where the peak intensity in the focus is highest. The location of the highest peak intensity may be determined using the technique taught by Abdukerim et at in *Opt. Express* vol. 27, pp. 32536-32555 (2019), incorporated herein by reference. To inscribe FBGs, the regeneratively amplified Ti:sapphire femtosecond laser system is operated at 1 Hz and the pulses are fired at the optical fiber 14 one at a time using a synchronized shutter. The morphology of the laser-induced modification in the fiber core 21 is revealed using scanning electron microscopy (SEM) on fiber samples cleaved along the yz-plane in the middle of the respective FBGs, as discussed below.

Figure 2:
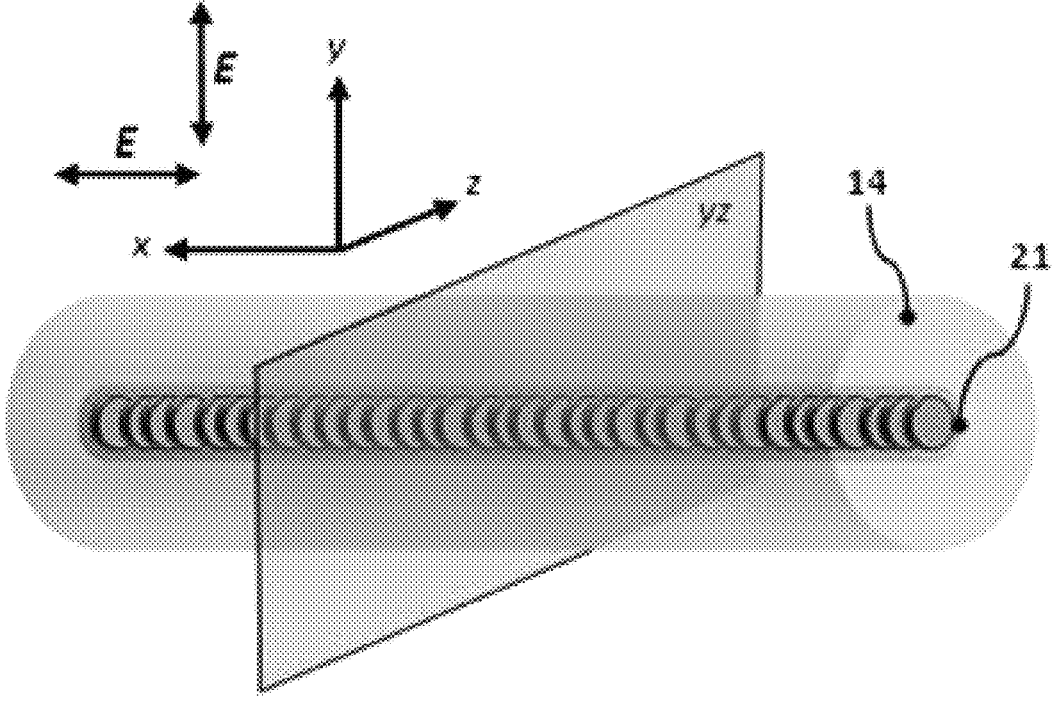
FIG. 2 denotes the orientation of the electric field vector E of the pulses (i.e., pulse polarization) with respect to the optical fiber of FIG. 1.

FIG. 2 denotes the orientation of the electric field vector E of the pulses (i.e., pulse polarization) with respect to the optical fiber, according to an aspect of this specification. The fiber axis is defined as the x-axis, while the yz-plane denotes the cross section of the fiber.

Abdukerim et al. in *Opt. Lett.*, vol. 45, pp 443-446 (2020) show that the peak laser intensity at the focus (i.e., at the center of the two-beam interference pattern produced by the phase mask 11) in the fiber core 21 can be calculated using $$I_p = \frac{2}{\pi} \frac{\mu E_p}{\tau \omega_x \omega_y},$$ (1)

where $E_p$ is the laser pulse energy, $\tau$ is the pulse duration (full-width half-maximum), and $2\omega_x$ and $2\omega_y$ are focal spot sizes (at the $1/e^2$-intensity level of the Gaussian intensity profile) along the x-axis and y-axis inside the fiber, respectively. The x-axis is parallel to the fiber axis and the mask grooves are aligned along the y-axis. The scaling coefficient $\mu$ is a product of three factors: $\mu=\mu_1\mu_2\mu_3$. The constant $\mu_1$ is related to the pulse shape, being $\mu_1=0.88$ for $\mathrm{sech}^2$-shaped laser pulses. The coefficient $\mu_2$ accounts for the polarization-dependent intensity distribution at the focus of the cylindrical lens 12. If there are no losses associated with Fresnel reflection at the front surface of the optical fiber 14 and the phase mask 11 has a 100% diffraction efficiency, the variation of the focal peak intensity along the x-axis at the fiber core 21 can be written as $$I_y(x) = I_0\left[1 + \cos\left(\frac{4\pi x}{\Lambda}\right)\right]$$ (2)

when the laser pulse polarization E (FIG. 2) is aligned along the y-axis (y-polarization) and as $$I_x(x) = I_0\left[1 + \cos(2\theta_1)\cos\left(\frac{4\pi x}{\Lambda}\right)\right]$$ (2a)

when the laser pulse polarization E is aligned along the x-axis (x-polarization). In Eqs. (2) and (2a), $I_0$ is the focal peak intensity in the incident beam 10 if it is focused inside the fiber without the phase mask in the beam path, $\Lambda$ is the mask pitch and $\theta_1=\arcsin[\lambda/(\Lambda n_1)]$ is the diffraction angle of the focused ±1 orders inside the fiber (with refractive index $n_1$) if the fiber lies in the diffraction plane and is oriented normal to the bisector between the orders. Hence, $\mu_2$, which is defined as the ratio of the peak intensity in the interference pattern to $I_0$, will be equal to 2 for y-polarization and will be given by $$\mu_2 = 2\frac{(\Lambda n_1)^2 - \lambda_2}{(\Lambda n_1)^2}$$ (3)

in the case of x-polarization. For fused silica ($n_1$=1.453 at $\lambda$=800 nm), i.e. the material from which the cladding of optical fiber 14 is predominantly made of, Eq. (3) gives $\mu_2$=1.47 for $\Lambda$=1.07 µm. The coefficient $\mu_3$ accounts for i) Fresnel reflection losses at the glass-air interfaces of the focusing cylindrical lens 12 and the front surface of the bare (i.e., without coating) optical fiber 14 and ii) polarization-dependent diffraction efficiency of the phase mask 11. In this disclosure, $\mu_3$ is ≈0.71 for y-polarization and ≈0.76 for x-polarization, $2\omega_x$ is ≈25 mm and $2\omega_y$ is ≈2.4 µm.

Figure 3:
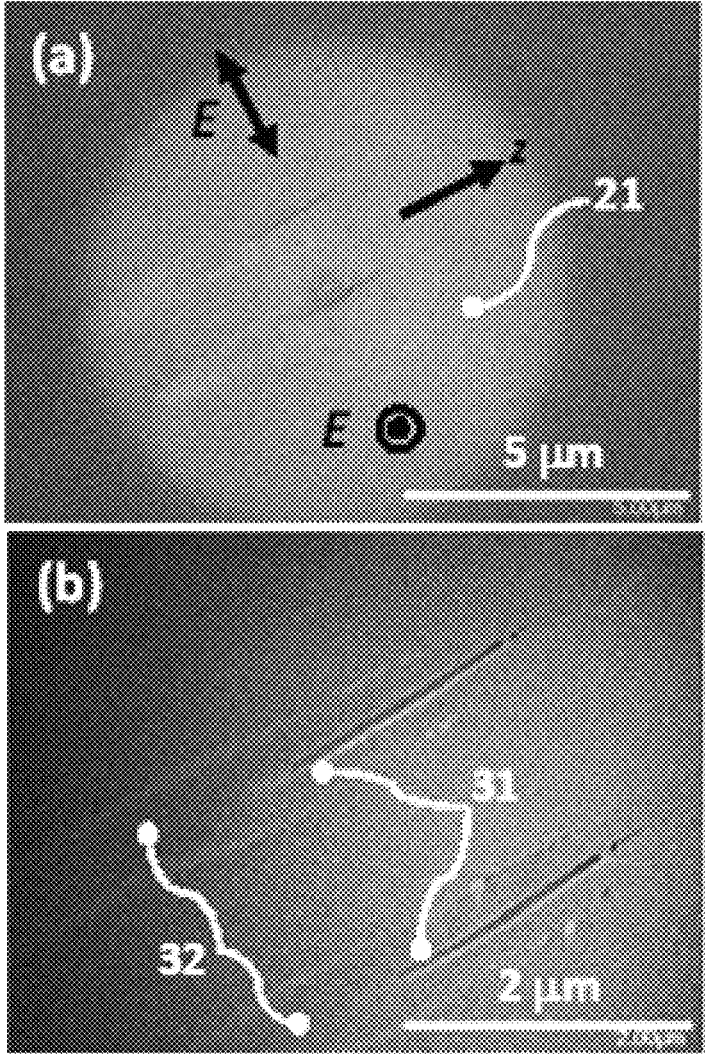
FIG. 3, comprising

In order to investigate how the laser pulse polarization E affects the modification morphology, the fiber core 21 is irradiated with one x-polarized pulse and one y-polarized pulse in two separate spots near the fiber axis. The orientation of the linear pulse polarization is adjusted by means of a polarizer and a half-wave plate. Using the dark-field microscopy technique taught by Mihailov et al. in U.S. Pat. No. 10,520,669, the onset of Type-II structural changes in the fiber core 21 in the single-pulse regime of irradiation are observed at $1.9\times10^3$ W/cm$^2$ for y-polarization and $2.2\times10^{13}$ W/cm$^2$ for x-polarization. The appearance of Type II modification at the respective intensities is also accompanied by a sharp growth of cladding modes in the transmission spectra of the resultant FBGs, as monitored using a broadband source (spectrally centered at 1550 nm) and an optical spectrum analyzer. The FBGs whose internal morphology is shown in the SEM images in FIG. 3 are written at a peak light intensity $I_p$ of $5.5\times10^{13}$ W/cm$^2$ for both polarizations, i.e., at ~2.5 times the single-pulse intensity threshold for Type II modification. The calculations of $I_p$ are based on the formalism presented by Abdukerim et al. in *Opt. Lett.*, vol. 45, pp 443-446 (2020).

FIG. 3 shows SEM images of modification in the core of optical fiber 14 induced by a single laser pulse. The orientation of the laser pulse polarization E (in front of the phase mask 11) is shown with double-sided arrows. FIG. 3(*a*) is an image of the cleaved surface of the cross section of the optical fiber 14 at the plane of a Bragg grating inscribed with a single pulse using the method set forth above. The core 21 of the optical fiber is denoted by the ~8 µm diameter light gray circle in the image. FIG. 3(*b*) is a magnified image of FIG. 3(*a*) showing micropores 31 embedded into smooth modification 32.

The SEM images in FIG. 3(*b*) clearly show that for single-pulse irradiation every grating plane of the FBG is built of a highly elongated micropore 31 (~0.1×2 µm$^2$ in the yz-plane) embedded into a region of smooth material modification 32 with a much larger cross-sectional area in the yz-plane, i.e., ~0.7×5 µm$^2$. It is also noteworthy that there is no characteristic difference between the modification produced with x-polarization and y-polarization. In this respect, the resultant structure comprising the index change is neither a nanograting that depends on the laser pulse polarization E and requires multiple pulses to be formed nor a laser-polarization insensitive spherical microvoid produced with a tightly focused single pulse using the point-by-point technique.

The spectral strength of ~15 mm-long FBGs inscribed at $I_p$~$5.5\times10^{13}$ W/cm$^2$ using one pulse is ~10 dB in transmission, with the corresponding broadband scattering loss being at the level of 0.02 dB if measured 10 nm away from the Bragg resonance on the long-wavelength side. The spectral strength and loss of the FBGs can be 7-12 dB and 0.01-0.03 dB, respectively, depending on how accurately the laser-induced material modification is positioned with respect to the fiber axis (±1.5 µm along the y- and z-axis in this disclosure). In this disclosure, the alignment of the line-shaped laser focus with respect to the fiber core 21 is performed using nonlinear photoluminescence as taught by Mihailov et al. in U.S. Pat. No. 10,520,669. The difference in the $n_{eff}$ along the slow and fast axis of the FBGs produced with x-polarization and y-polarization is ~$2\times10^{-5}$ and ~$3\times10^{-5}$, respectively. The high-temperature behavior (up to 1000° C.) of such micropore-based FBGs is described by Abdukerim et al. in *Opt. Lea.*, vol. 45, pp 443-446 (2020), incorporated herein by reference.

Low-loss thermally-stable FBGs that are built of elongated micropores 31 can be inscribed through the protective polymer coating (e.g., acrylic or polyimide coating) on the optical fiber 14. As in the case of bare fibers, the alignment of the line-shaped laser focus with respect to the fiber core 21 may be performed using nonlinear photoluminescence as taught by Mihailov et al. in U.S. Pat. No. 10,520,669. If the focusing lens 12 is corrected for spherical aberration and the distance between the mask 11 and the fiber 14 is chosen so as to determine the location of the highest peak intensity in the laser focus, as taught by Abdukerim et al. in *Opt. Express* vol. 27, pp. 32536-32555 (2019), no visible damage to the coating occurs at focused intensities that are sufficient to produce elongated micropores 31 in the fiber core 21.

Figure 4:
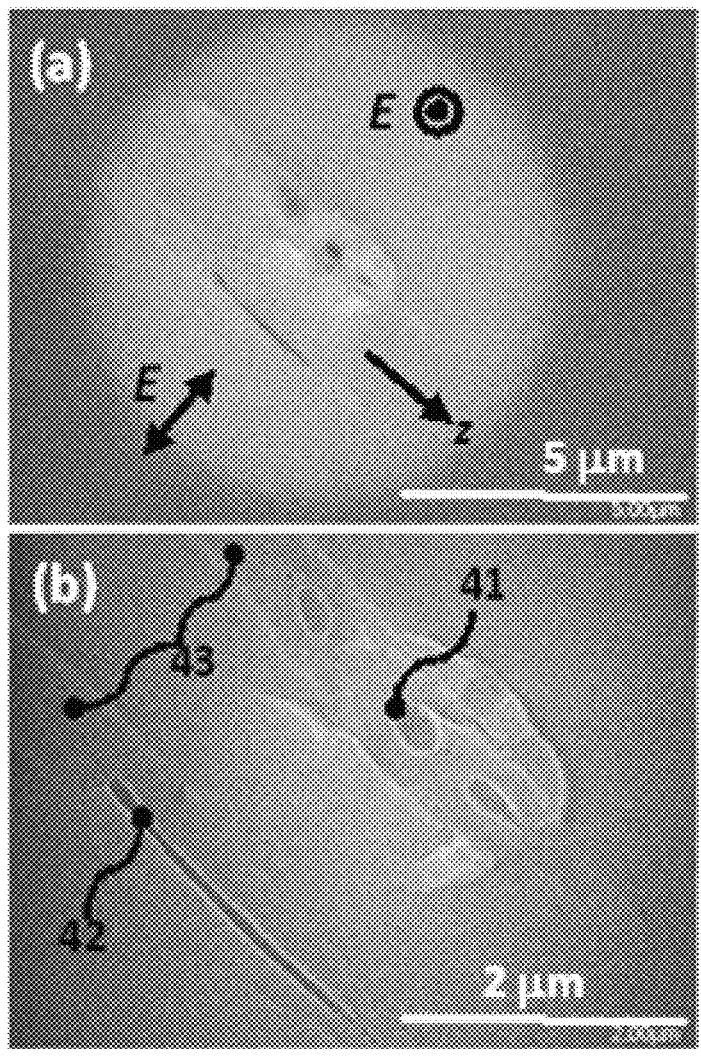
FIG. 4, comprising

When more than one pulse at $I_p \sim 5.5 \times 10^{13}$ W/cm$^2$, the rest of the laser writing parameters being the same as disclosed above, is used for the inscription, the FBG spectral strength, scattering loss and birefringence increase. As an example, for a five-pulse irradiation the FBG spectral strength becomes more than 20 dB in transmission for both x- and y-polarization, with the respective scattering loss of ~0.2 dB for x-polarization and ~0.05 dB for y-polarization, and the respective birefringence of $\sim 3 \times 10^{-5}$ for x-polarization and $\sim 6 \times 10^{-5}$ for y-polarization. As shown in FIG. 4, this is caused by i) growth of micropores and ii) the polarization-sensitive nature of the corresponding light-matter interaction (Hnatovsky et al. *Opt. Lett.*, vol. 42, pp. 399-402, (2017)). Similar to the one-pulse irradiation regime set forth above, to investigate how the laser pulse polarization E affects the modification morphology, the fiber core 21 is irradiated with five x-polarized pulses and five y-polarized pulse in two separate spots near the fiber axis. The elongated micropores 31 that are axially symmetric with respect to the z-axis when the fiber is irradiated with one laser pulse become stretched perpendicular to the electric field vector E of the pulses when several pulses are used, as shown in FIG. 4 where micropores 41 and 42 are produced with five x-polarized and y-polarized pulses, respectively. As in the case of single-pulse irradiation, micropores 41 and 42 produced with five pulses are embedded into smooth material modification 43 with a much larger cross-sectional area in the yz-plane. The high-temperature behavior (up to 1000° C.) of Type II FBGs produced with several pulses is described by Abdukerim et al. in *Opt. Lett.*, vol. 45, pp 443-446 (2020), incorporated herein by reference.

FIG. 4 shows SEM images of modification in the core of optical fiber 14 induced by five laser pulses. The orientation of the laser pulse polarization E (in front of the phase mask 11) is shown with double-sided arrows. FIG. 4(*a*) is an image of the cleaved surface of the cross section of optical fiber 14 at the plane of a Bragg grating inscribed with five pulses using the method set forth above. The core 21 of the optical fiber is denoted by the ~8 μm diameter light gray circle in the image. FIG. 4(*b*) is a magnified image of FIG. 4(*a*) showing micropores 41 and 42 embedded into smooth modification 43.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method for inscribing a Bragg grating in an optical waveguide, comprising the steps of:

providing electromagnetic radiation from an ultrashort pulse duration laser;

providing a focusing optical element to focus the electromagnetic radiation from the ultrashort pulse duration laser;

providing a diffractive optical element that when exposed to the focused electromagnetic radiation generates an interference pattern on the optical waveguide; and irradiating the optical waveguide with the electromagnetic radiation to form a Bragg grating, the electromagnetic radiation with the interference pattern incident on the optical waveguide being sufficiently intensive to cause a permanent, Type II change in the index of refraction within multiple Bragg grating planes in the core of the optical waveguide, wherein the Type II change results from at least one micropore formed directly by the focused electromagnetic radiation with the interference pattern.

2. The method of claim 1 wherein the electromagnetic radiation comprises a single laser pulse.

3. The method of claim 1 wherein the electromagnetic radiation comprises plurality of laser pulses, wherein said plurality is equal or less than ten.

4. The method of claim 1, wherein the electromagnetic radiation has a pulse duration in the order of 1 femtosecond to 1 picosecond.

5. The method of claim 1, wherein the wavelength of the electromagnetic radiation is in a range from 150 nm to 2.0 microns.

6. The method of claim 1, further comprising providing a focusing optical element corrected for spherical aberration for focusing the electromagnetic radiation on the diffractive optical element.

7. The method of claim 1, further comprising providing a cylindrical lens corrected for spherical aberration for focusing the electromagnetic radiation on the diffractive optical element.

8. The method of claim 1, further comprising positioning the optical waveguide at a distance with respect to the diffractive optical element where the confocal parameter of a line-shaped laser focus created by the focusing optical element is smallest and the peak intensity in the focus is highest due to substantial or complete cancelation of i) negative spherical aberration and conical diffraction caused by the diffractive optical element and ii) chromatic aberration of the focusing optical element and chromatic dispersion of the diffractive optical element.

9. The method of claim 1, wherein the change in the index of refraction within multiple Bragg grating planes in the core of the optical waveguide results from at least one elongated micropore.

10. The method of claim 1, wherein the change in the index of refraction within multiple Bragg grating planes in the core of the optical waveguide results from a plurality of spherical micropores.

11. The method of claim 1, wherein scattering loss due to the permanent, Type II change in the index of refraction in the optical waveguide is less than $10^{-5}$ dB per grating period.

12. An apparatus for inscribing a Bragg grating in an optical waveguide, comprising:

an ultrashort pulse duration laser for providing electromagnetic radiation;

a focusing optical element to focus the electromagnetic radiation from an ultrashort pulse duration laser; and a diffractive optical element that when exposed to the focused electromagnetic radiation from the focusing optical element produces an interference pattern in the optical waveguide, wherein positioning the optical waveguide at a distance with respect to the diffractive optical element along the propagation direction of the electromagnetic radiation where the confocal parameter of line-shaped laser focus with the interference pattern is smallest and the peak intensity in the focus is highest causes the i) negative spherical aberration and conical diffraction caused by the diffractive optical element and ii) chromatic aberration of the focusing optical element and chromatic dispersion of the diffractive optical element to substantially or completely cancel each other out; and wherein irradiating the optical waveguide with the electromagnetic radiation with the interference pattern forms a Bragg grating, the electromagnetic radiation incident on the optical waveguide being sufficiently intensive to cause permanent, Type II change in the index of refraction within multiple Bragg grating planes in the core of the optical waveguide wherein the Type II change results from at least one micropore formed directly by the focused electromagnetic radiation with the interference pattern when exposed to one of either a single laser pulse or a plurality of laser pulses, wherein said plurality is equal or less than ten.

13. The apparatus of claim 12, wherein the at least one micropore comprises at least one elongated micropore.

14. The apparatus of claim 12, wherein the at least one micropore comprises a plurality of spherical micropores.

15. The apparatus of claim 12, wherein the scattering loss due to the permanent, Type II change in the index of refraction is less than $10^{-5}$ dB per grating period.

16. The apparatus of claim 12, wherein the optical waveguide is an optical fiber.

17. The apparatus of claim 12, wherein the optical waveguide is a polymer-coated optical fiber.

18. The apparatus of claim 12, wherein the optical waveguide is a buried channel waveguide.

19. The apparatus of claim 12, wherein the optical waveguide is a ridge waveguide.

20. The apparatus of claim 12, wherein the electromagnetic radiation has a pulse duration in the order of 1 femtosecond to 1 picosecond.

21. The apparatus of claim 12, wherein the wavelength of the electromagnetic radiation is in a range from 150 nm to 2.0 microns.

22. The apparatus of claim 12, wherein the ultrashort pulse duration laser comprises a Ti-sapphire regeneratively amplified laser system operating at a central wavelength of 800 nm.

23. The apparatus of claim 12, wherein the diffractive optical element comprises a uniformly pitched phase mask.

24. The apparatus of claim 12, wherein the diffractive optical element comprises a chirped phase mask.

25. The apparatus of claim 12, wherein the diffractive optical element comprises a phase-shifted phase mask.

26. The apparatus of claim 12, wherein the focusing optical element is corrected for spherical aberration for focusing the electromagnetic radiation on the diffractive optical element.

27. The apparatus of claim 12, further comprising providing a cylindrical lens corrected for spherical aberration for focusing the electromagnetic radiation on the diffractive optical element.

\* \* \* \* \*